United States Patent
Zhu et al.

(10) Patent No.: US 8,753,931 B2
(45) Date of Patent: Jun. 17, 2014

(54) COST-EFFECTIVE GATE REPLACEMENT PROCESS

(75) Inventors: Ming Zhu, Singapore (SG); Jyun-Ming Lin, Hsinchu (TW); Wei Cheng Wu, Zhubei (TW); Bao-Ru Young, Zhubei (TW); Hak-Lay Chuang, Singapore (SG)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 8 days.

(21) Appl. No.: 13/440,848

(22) Filed: Apr. 5, 2012

(65) Prior Publication Data

US 2013/0264652 A1  Oct. 10, 2013

(51) Int. Cl.
*H01L 21/336* (2006.01)
*H01L 21/8234* (2006.01)
*H01L 27/092* (2006.01)

(52) U.S. Cl.
CPC .. *H01L 21/82345* (2013.01); *H01L 21/823443* (2013.01); *H01L 27/0922* (2013.01)
USPC ............ 438/199; 257/369; 257/E21.178

(58) Field of Classification Search
CPC .............. H01L 21/823443; H01L 21/82345; H01L 27/092; H01L 27/0922; H01L 29/42372
USPC ............ 257/365, 369, E29.04, E21.176, 257/E21.178, E21.198; 438/199
See application file for complete search history.

(56) References Cited

U.S. PATENT DOCUMENTS

| 7,084,025 | B2 * | 8/2006 | Phua et al. | 438/199 |
|---|---|---|---|---|
| 7,795,689 | B2 * | 9/2010 | Kawakita | 257/369 |
| 8,093,116 | B2 * | 1/2012 | Chung et al. | 438/183 |
| 8,461,049 | B2 * | 6/2013 | Chang et al. | 438/696 |
| 2008/0023772 | A1 * | 1/2008 | Kawakita | 257/369 |
| 2009/0181504 | A1 * | 7/2009 | Lin et al. | 438/199 |
| 2010/0052075 | A1 * | 3/2010 | Yeh et al. | 257/410 |
| 2010/0124818 | A1 * | 5/2010 | Lee et al. | 438/589 |
| 2011/0081774 | A1 * | 4/2011 | Yeh et al. | 438/591 |
| 2012/0068261 | A1 * | 3/2012 | Kwon et al. | 257/331 |
| 2013/0026579 | A1 * | 1/2013 | Lu et al. | 257/369 |

OTHER PUBLICATIONS

U.S. Appl. No. 13/353,975, filed Jan. 19, 2012, by inventors Yuan-Sheng Huang, Tzu-Yen Hsieh, Ming-Ching Chang, ,Chao-Cheng Chen, Chia-Jen Chen for "Composite Dummy Gate with Conformal Polysilicon Layer for Finfet Device," 17 pages of text and 10 pages of drawings.
U.S. Appl. No. 13/328,382, filed Dec. 16, 2011, by inventors Hak-Lay Chuang and Ming Zhu for "Enhanced Gate Replacement Process for High-K Metal Gate Technology", 18 pages of text and 15 pages of drawings.

* cited by examiner

*Primary Examiner* — Allan R Wilson
(74) *Attorney, Agent, or Firm* — Haynes and Boone, LLP

(57) ABSTRACT

The present disclosure provides a method of fabricating a semiconductor device. The method includes forming a first gate structure and a second gate structure over a substrate. The first and second gate structures each include a high-k dielectric layer located over the substrate, a capping layer located over the high-k dielectric layer, an N-type work function metal layer located over the capping layer, and a polysilicon layer located over the N-type work function metal layer. The method includes forming an inter-layer dielectric (ILD) layer over the substrate, the first gate structure, and the second gate structure. The method includes polishing the ILD layer until a surface of the ILD layer is substantially co-planar with surfaces of the first gate structure and the second gate structure. The method includes replacing portions of the second gate structure with a metal gate. A silicidation process is then performed to the semiconductor device.

20 Claims, 15 Drawing Sheets

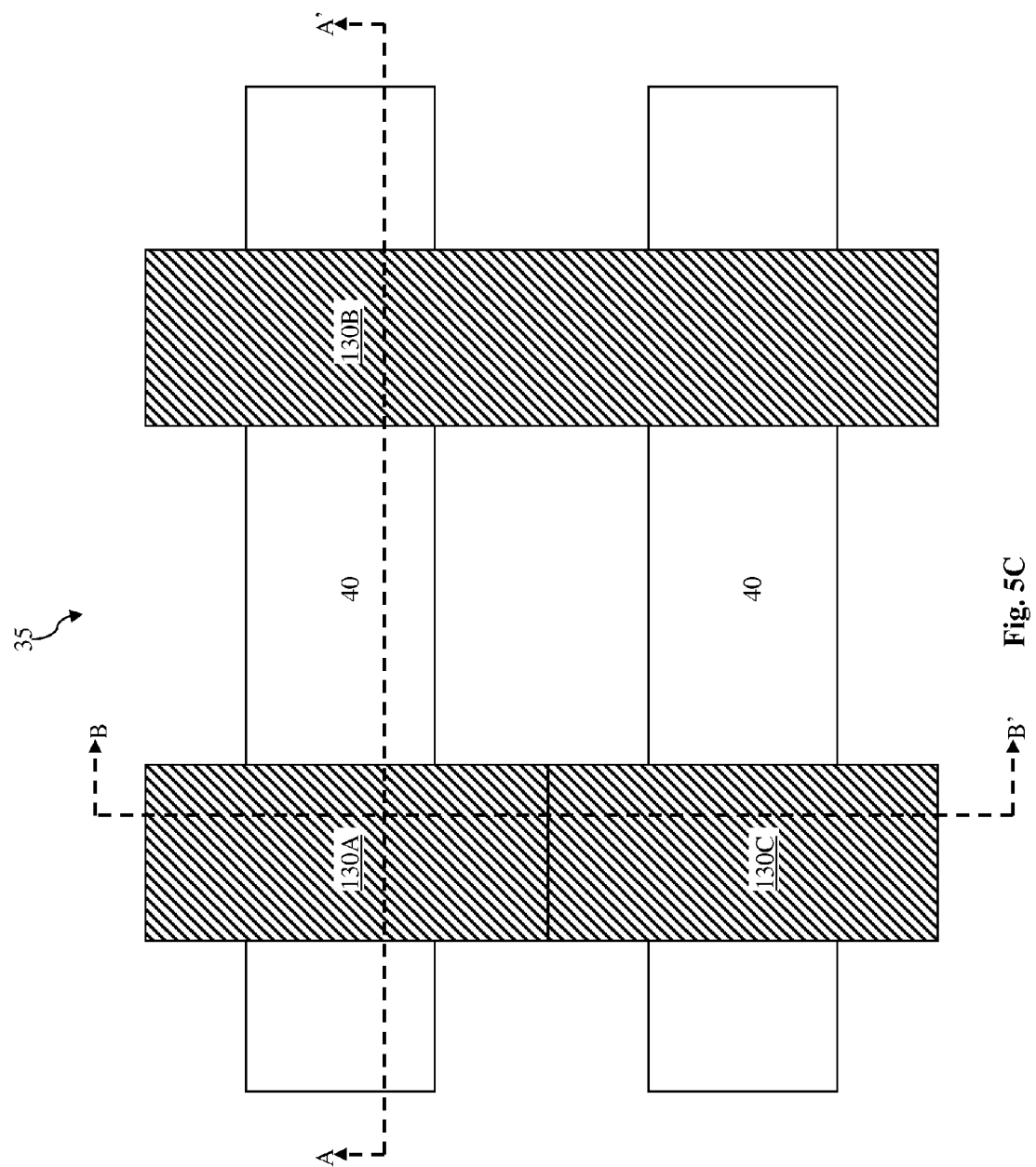

COST-EFFECTIVE GATE REPLACEMENT PROCESS

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased.

To enhance the performance of ICs, metal gate transistors have been used in recent years. However, conventional methods of forming metal gate transistors may be complex and expensive. For example, the NMOS and PMOS gates may require their own formation processes, which not only increase fabrication costs due to the added complexity, but may also lead to potential process defects and uniformity issues.

Therefore, while existing methods of fabricating metal gate transistors have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 2-4 and 5A-9A and 5B-9B illustrate cross-sectional views of the semiconductor device at various stages of fabrication according to the method of FIG. 1.

FIG. 5C illustrates a top view of the semiconductor device at various stages of fabrication according to the method of FIG. 1.

DETAILED DESCRIPTION

Figure 1:
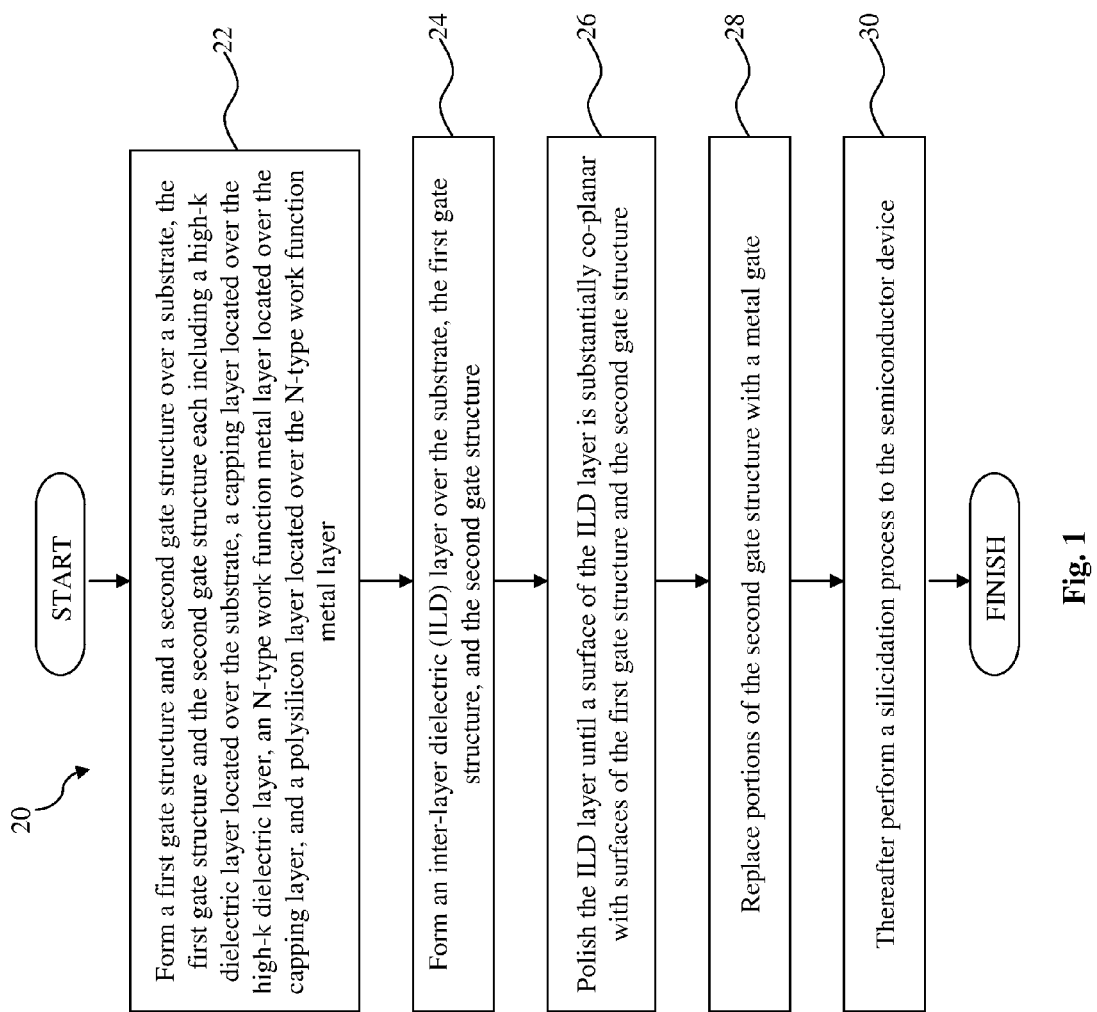
FIG. 1 is a flowchart illustrating a method of fabricating a semiconductor device according to various aspects of the present disclosure.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Illustrated in FIG. 1 is a flowchart of a method 20 for fabricating a semiconductor device. FIGS. 2-9 are diagrammatic fragmentary cross-sectional side views, of the semiconductor device during various fabrication stages. The semiconductor device may include an integrated circuit (IC) chip, system on chip (SoC), or portion thereof, that may include various passive and active microelectronic devices such as resistors, capacitors, inductors, diodes, metal-oxide semiconductor field effect transistors (MOSFET), complementary metal-oxide semiconductor (CMOS) transistors, bipolar junction transistors (BJT), laterally diffused MOS (LDMOS) transistors, high power MOS transistors, or other types of transistors. It is understood that FIGS. 2-9 have been simplified for a better understanding of the inventive concepts of the present disclosure. Accordingly, it should be noted that additional processes may be provided before, during, and after the method 20 of FIG. 1, and that some other processes may only be briefly described herein.

Referring to FIG. 1, the method 20 includes a block 22 in which a first gate structure and a second gate structure are formed over a substrate. The first gate structure and the second gate structure each include a high-k dielectric layer located over the substrate, a capping layer located over the high-k dielectric layer, an N-type work function metal layer located over the capping layer, and a polysilicon layer located over the N-type work function metal layer. The method 20 includes a block 24 in which an inter-layer dielectric (ILD) layer is formed over the substrate, the first gate structure, and the second gate structure. The method 20 includes a block 26 in which the ILD layer is polished until a surface of the ILD layer is substantially co-planar with surfaces of the first gate structure and the second gate structure. The method 20 includes a block 28 in which portions of the second gate structure are replaced with a metal gate. The method 20 includes a block 30 in which a silicidation process is performed to the semiconductor device thereafter.

Figure 2:
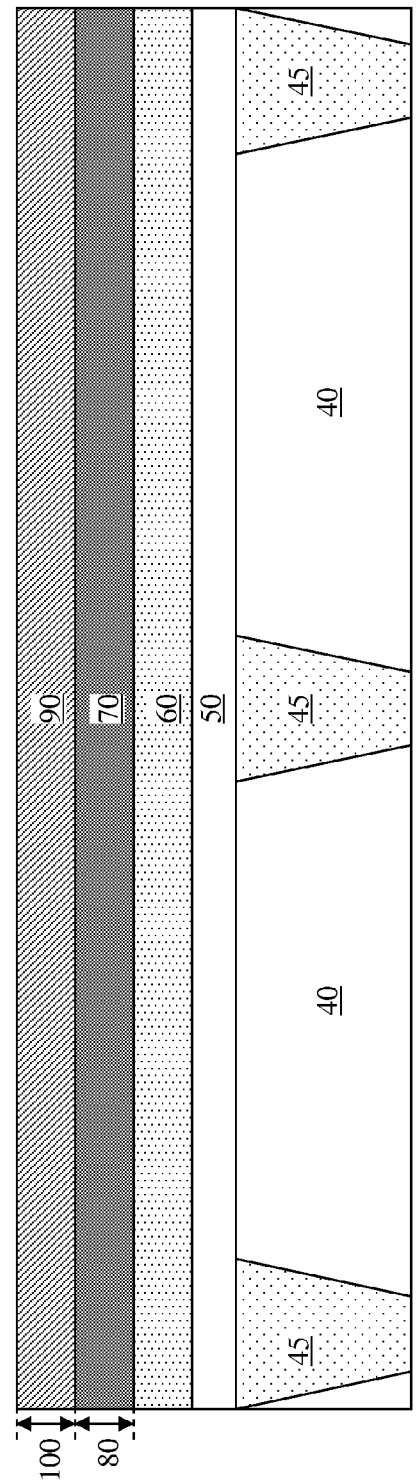

Referring to FIG. 2, a semiconductor device 35 is fabricated in accordance with the method 20 of FIG. 1. The semiconductor device 35 has a substrate 40. The substrate 40 is a silicon substrate doped with a P-type dopant such as boron (for example a P-type substrate). Alternatively, the substrate 40 could be another suitable semiconductor material. For example, the substrate 40 may be a silicon substrate that is doped with an N-type dopant such as phosphorous or arsenic (an N-type substrate). The substrate 40 may alternatively be made of some other suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. Further, the substrate 40 could include an epitaxial layer (epi layer), may be strained for performance enhancement, and may include a silicon-on-insulator (SOI) structure.

Referring back to FIG. 2, shallow trench isolation (STI) features 45 are formed in the substrate 40. The STI features 45 are formed by etching recesses (or trenches) in the substrate 45 and filling the recesses with a dielectric material. In the present embodiment, the dielectric material of the STI features 45 includes silicon oxide. In alternative embodiments, the dielectric material of the STI features 45 may include silicon nitride, silicon oxy-nitride, fluoride-doped silicate (FSG), and/or a low-k dielectric material known in the art. In other embodiments, deep trench isolation (DTI) features may be formed in place of, or in combination with, the STI features 45.

Thereafter, an interfacial layer 50 is optionally formed over the substrate 40. The interfacial layer 50 is formed by an atomic layer deposition (ALD) process and includes silicon oxide ($SiO_2$).

A gate dielectric layer 60 is then formed over the interfacial layer 50. The gate dielectric layer 60 is formed by an ALD process. The gate dielectric layer 60 includes a high-k dielectric material. A high-k dielectric material is a material having a dielectric constant that is greater than a dielectric constant of $SiO_2$, which is approximately 4. In an embodiment, the gate dielectric layer 60 includes hafnium oxide ($HfO_2$), which has a dielectric constant that is in a range from approximately 18 to approximately 40. In alternative embodiments, the gate dielectric layer 60 may include one of $ZrO_2$, $Y_2O_3$, $La_2O_5$, $Gd_2O_5$, $TiO_2$, $Ta_2O_5$, HfErO, HfLaO, HfYO, HfGdO, HfAlO, HfZrO, HfTiO, HfTaO, and SrTiO.

A capping layer 70 is formed over a portion of the gate dielectric layer 60. The formation of the capping layer 70 includes one or more deposition and patterning processes. In some embodiments, the capping layer 70 includes a lanthanum oxide material ($LaO_x$, where x is an integer). The $LaO_x$ material of the capping layer helps tune a work function of an NMOS transistor gate, such that a desired threshold voltage may be achieved for the NMOS transistor. It is understood that the $LaO_x$ material is formed over both an NMOS transistor region and a PMOS transistor region at this stage of fabrication. Suitable materials for the capping layer 70 can be rare earth oxides such as LaOx, GdOx, DyOx, or ErOx. The capping layer 70 has a thickness 80. In some embodiments, the thickness 80 is in a range from about 5 Angstroms to about 20 Angstroms.

A work function layer 90 is formed over the capping layer 70 and the gate dielectric layer 60. In some embodiments, the work function layer 90 includes a titanium nitride (TiN) material. The work function layer 90 works in conjunction with the capping layer 70 to tune the work function of the gate for the NMOS transistor. The work function layer 90 has a thickness 100. In some embodiments, the thickness 100 is in a range from about 10 Angstroms to about 50 Angstroms.

Figure 3:
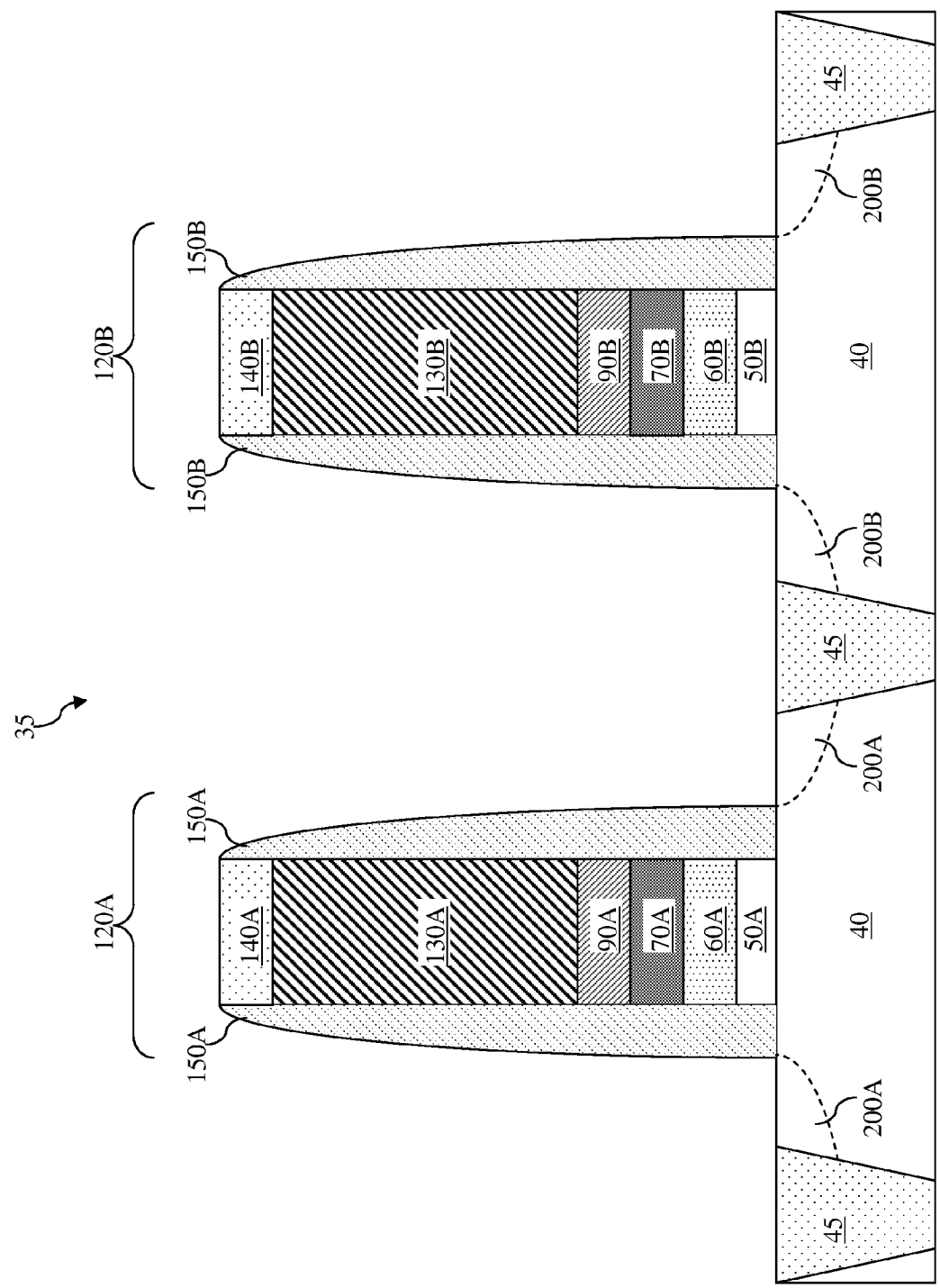

Referring to FIG. 3, gate structures 120A-120B are formed. The gate structure 120A is formed over an NMOS region of the substrate 40, and the gate structure 120B is formed over a PMOS region of the substrate 40. Thus, the gate structure 120A is an NMOS gate, and the gate structure 120B is a PMOS gate. The gate structures 120A-120B include gate electrodes 130A and 130B, hard masks 140A and 140B, and spacers 150A and 150B, respectively. The formation of the gate structures 120A-120B may include depositing a gate electrode layer 130 and thereafter patterning the gate electrode layer 130 and the layers therebelow with patterned hard masks 140A and 140B.

The gate electrode 130A is a functional gate electrode for the gate structure 120A. The gate electrode 130B is a dummy gate electrode for the gate structure 120B. In some embodiments, the gate electrodes 130A-130B each include a polysilicon material. In some embodiments, before polysilicon material is patterned into the gate electrodes 130A and 130B, an N-type dopant will be implanted into the polysilicon material. The concentration of the N-type dopant may be relatively high. As such, the gate electrode 130A will be capable of serving as the gate electrode for an NMOS gate.

The hard masks 140A-140B include a dielectric material, such as silicon oxide or silicon nitride. The gate spacers 150A-150A include a dielectric material. In some embodiments, the gate spacers 150A-150B include silicon nitride. In alternative embodiments, the gate spacers 150A-150B may include silicon oxide, silicon carbide, silicon oxy-nitride, or combinations thereof.

Thereafter, heavily doped source and drain regions 200A and 200B (also referred to as S/D regions) are formed in the NMOS and PMOS portions of the substrate 40, respectively. The S/D regions 200A-200B may be formed by an ion implantation process or a diffusion process known in the art. N-type dopants such as phosphorus or arsenic may be used to form the NMOS S/D regions 200A, and P-type dopants such as boron may be used to form the PMOS S/D regions 200B. As is illustrated in FIG. 3, the S/D regions 200A-200B are aligned with the outer boundaries of the gate spacers 150A-150B, respectively. Since no photolithography process is required to define the area or the boundaries of the S/D regions 200A-200B, it may be said that the S/D regions 200A-200B are formed in a "self-aligning" manner. One or more annealing processes are performed on the semiconductor device 35 to activate the S/D regions 200A-200B. It is also understood that in some embodiments, lightly-doped source/drain (LDD) regions may be formed in both the NMOS and PMOS regions of the substrate before the gate spacers are formed. For reasons of simplicity, the LDD regions are not specifically illustrated herein.

Note that no silicidation process is performed at this stage of fabrication. In other words, S/D regions 200A-200B have no silicide layers formed thereon, nor do the gate electrodes 130A-130B. This is done so that a polishing process performed later will cause contamination, as discussed in more detail below with reference to the polishing process.

Figure 4:
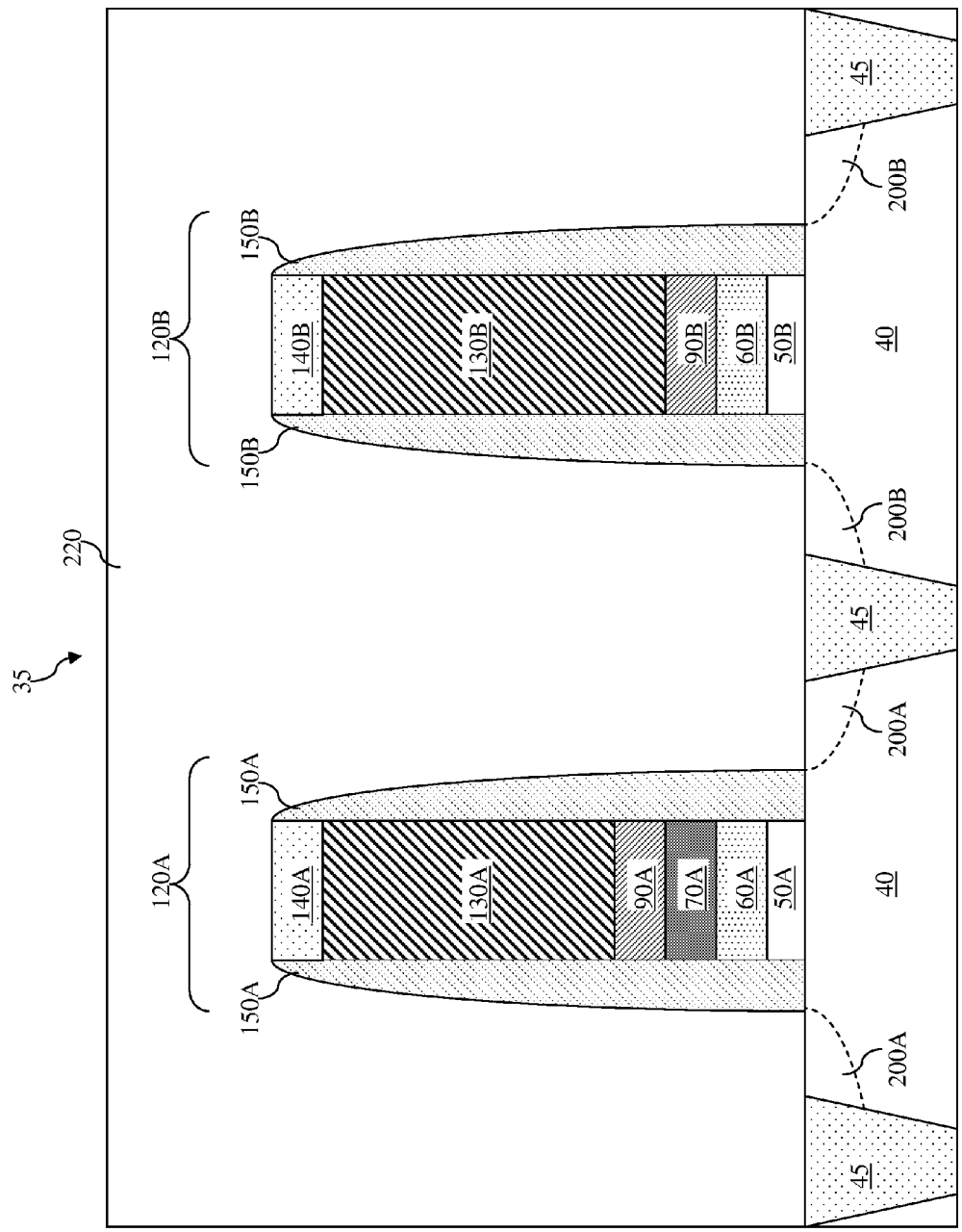

Referring now to FIG. 4, an inter-layer (or inter-level) dielectric (ILD) layer 220 is formed over the substrate 40 and the gate structure 220. The ILD layer 220 may be formed by chemical vapor deposition (CVD), high density plasma CVD, spin-on, sputtering, or other suitable methods. In an embodiment, the ILD layer 220 includes silicon oxide. In other embodiments, the ILD layer 220 may include silicon oxy-nitride, silicon nitride, or a low-k material.

Figure 5A:
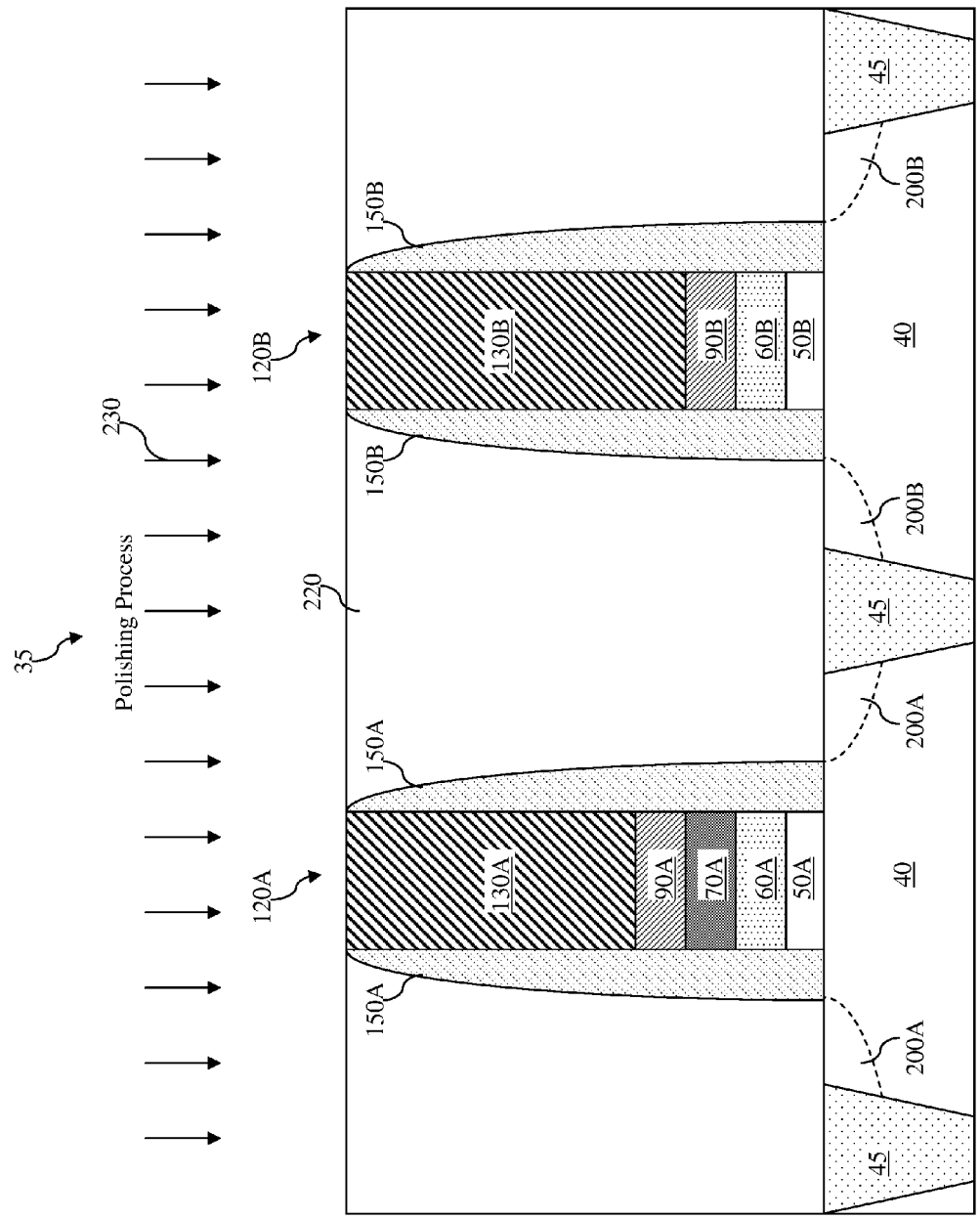

Referring to FIG. 5A, a polishing process 230 (for example a chemical-mechanical-polishing (CMP) process) is performed on the ILD layer 220 to remove portions of the ILD layer 220. The polishing is performed until a top surface of the dummy gate electrodes of gate structures 120A-120B is exposed. The hard masks 140A-140B are also removed by the polishing process 230.

As discussed above, no silicide features are formed on the gate electrodes 130A-130B. This is done so that the polishing process 230 can be performed without causing contamination. In more detail, had silicide features (e.g., NiSi) been formed on the gate electrodes 130A-130B, a polishing pad used in the polishing process 230 will likely spread the silicide particles elsewhere on the wafer surface as the polishing pad grinds away the electrodes 130A-130B. The silicide particles may contaminate other regions of the wafer and are therefore undesirable. Here, since no silicide features are formed on the gate electrodes 130A-130B, the polishing pad of the polishing process 230 can grind away at the surfaces of the gate electrodes 130A-130B without spreading silicide particles to other regions of the wafer, thereby reducing silicide contamination. According to various aspects of the present disclosure, the silicide formation process will be moved to a later fabrication stage.

Following the polishing process 230, the top surfaces of the gate structures 120A-120B are substantially co-planar with the top surface of the ILD layer 220 on either side of the gate structures 120A-120B. The presence of the dummy gate electrode 130B helps reduce a loading effect during the polishing process 230, since the height of the gate structure 120B is substantially the same as the height of the gate structure 120A.

Figure 5B:
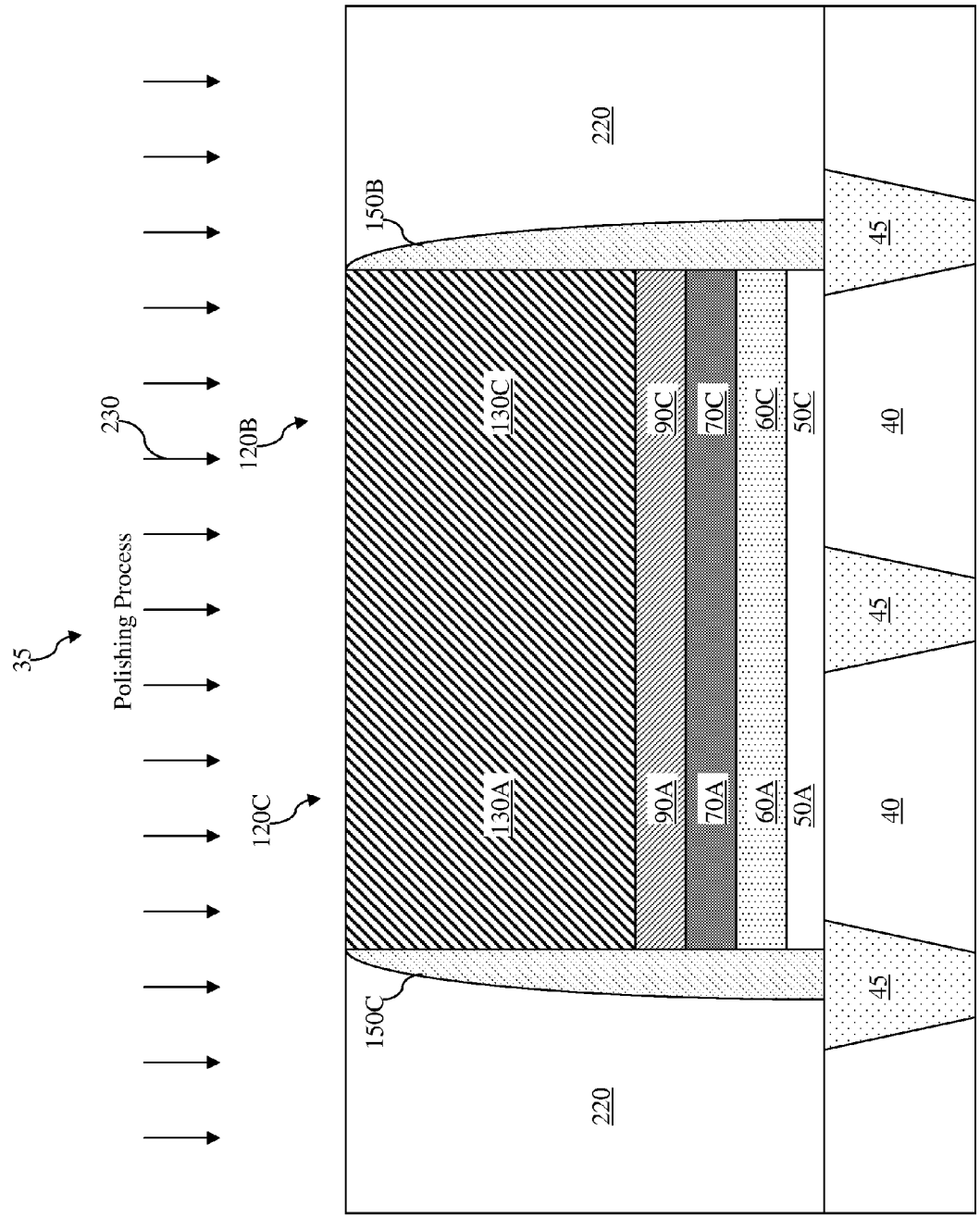

To provide more clarity and detail of the fabrication process, a diagrammatic fragmentary cross-sectional side view of the semiconductor device 35 taken in a different direction is shown in FIG. 5B, and a diagrammatic fragmentary top view of the semiconductor device 35 is shown in FIG. 5C. Specifically, the cross-sectional view of FIG. 5A is taken along the dashed lines A-A' of the top view of FIG. 5C, and the cross-sectional view of FIG. 5B is taken along the dashed lines B-B' of the top view of FIG. 5C. As is shown in FIGS. 5A and 5C, the gate electrodes 130A and 130B are NMOS and PMOS gate electrodes, respectively, where they are spaced apart from each other. As is shown in FIGS. 5B and 5C, the gate electrodes 130A and 130C are NMOS and PMOS gate electrodes, respectively, where they are bordering or abutting each other.

Figure 6A:
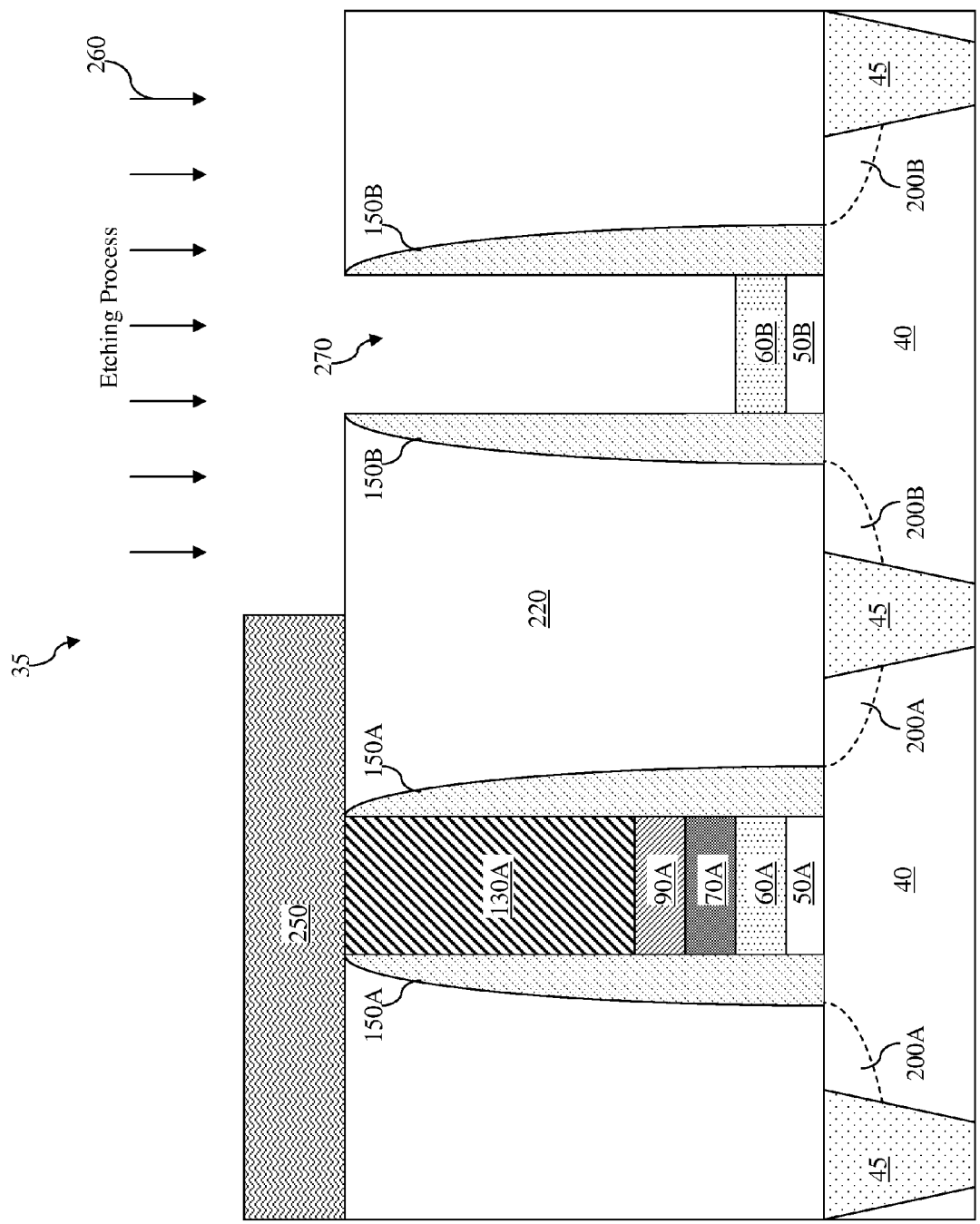
Figure 6B:
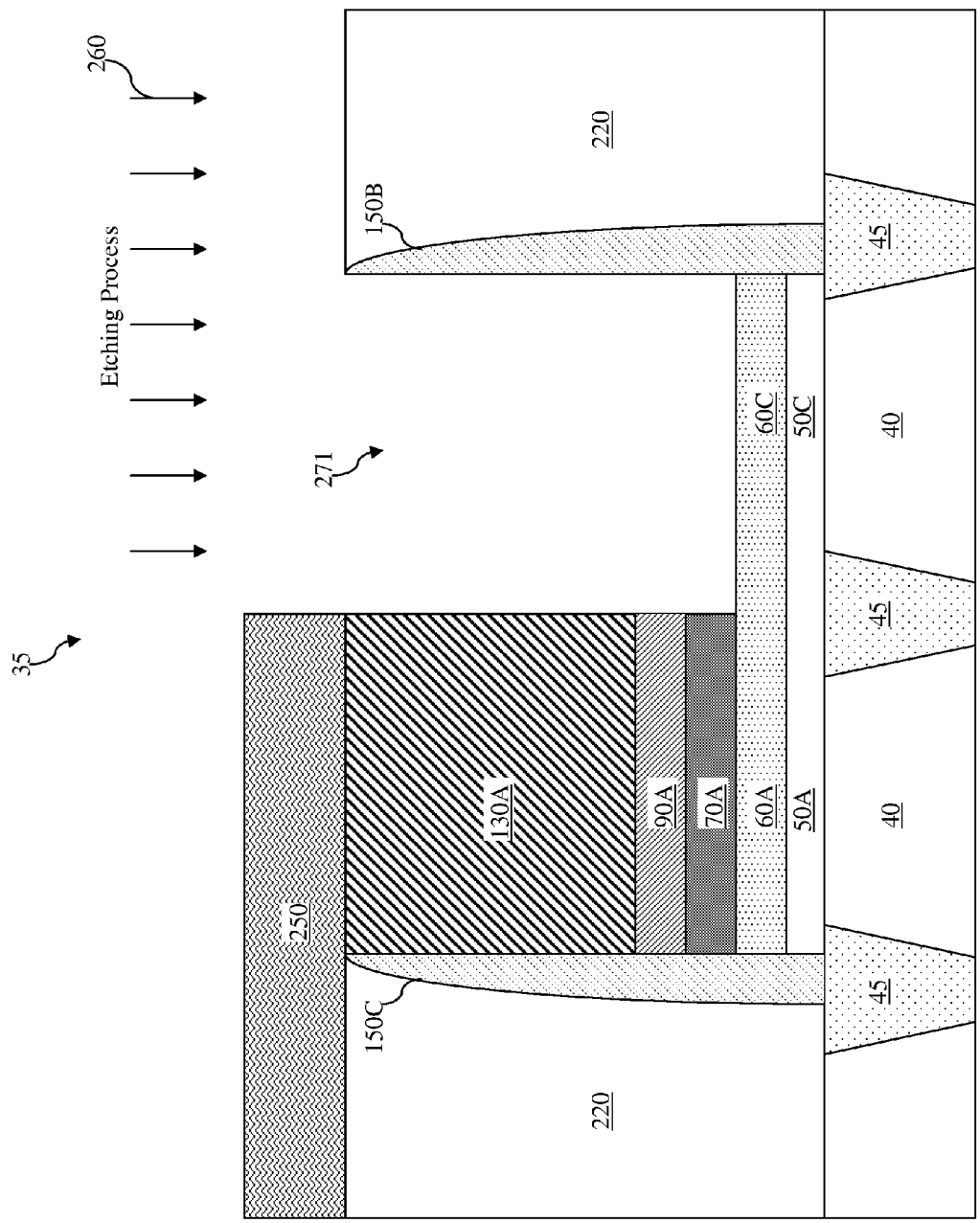

FIGS. 6A-9A and 6B-9B are also different cross-sectional side views (similar to the cross-sectional side views of FIGS. 5A-5B) corresponding to subsequent fabrication stages. The top views of these fabrication stages are not illustrated for the sake of simplicity, however. Referring now to FIGS. 6A-6B, a patterned photoresist mask 250 is formed over the NMOS transistor, so that the PMOS transistor is exposed. The formation of the patterned photoresist mask 250 may involve one or more spin coating, exposing, developing, baking, and rinsing processes (not necessarily performed in that order). Thereafter, an etching process 260 (for example a dry etching process) is performed to remove the PMOS dummy gate electrodes 130B-130C as well as portions of the work function layer 90B-90C and the capping layer 70B-70C, thereby forming openings or trenches 270 and 271. The photoresist mask 250 is subsequently removed using a stripping or ashing process.

Figure 7A:
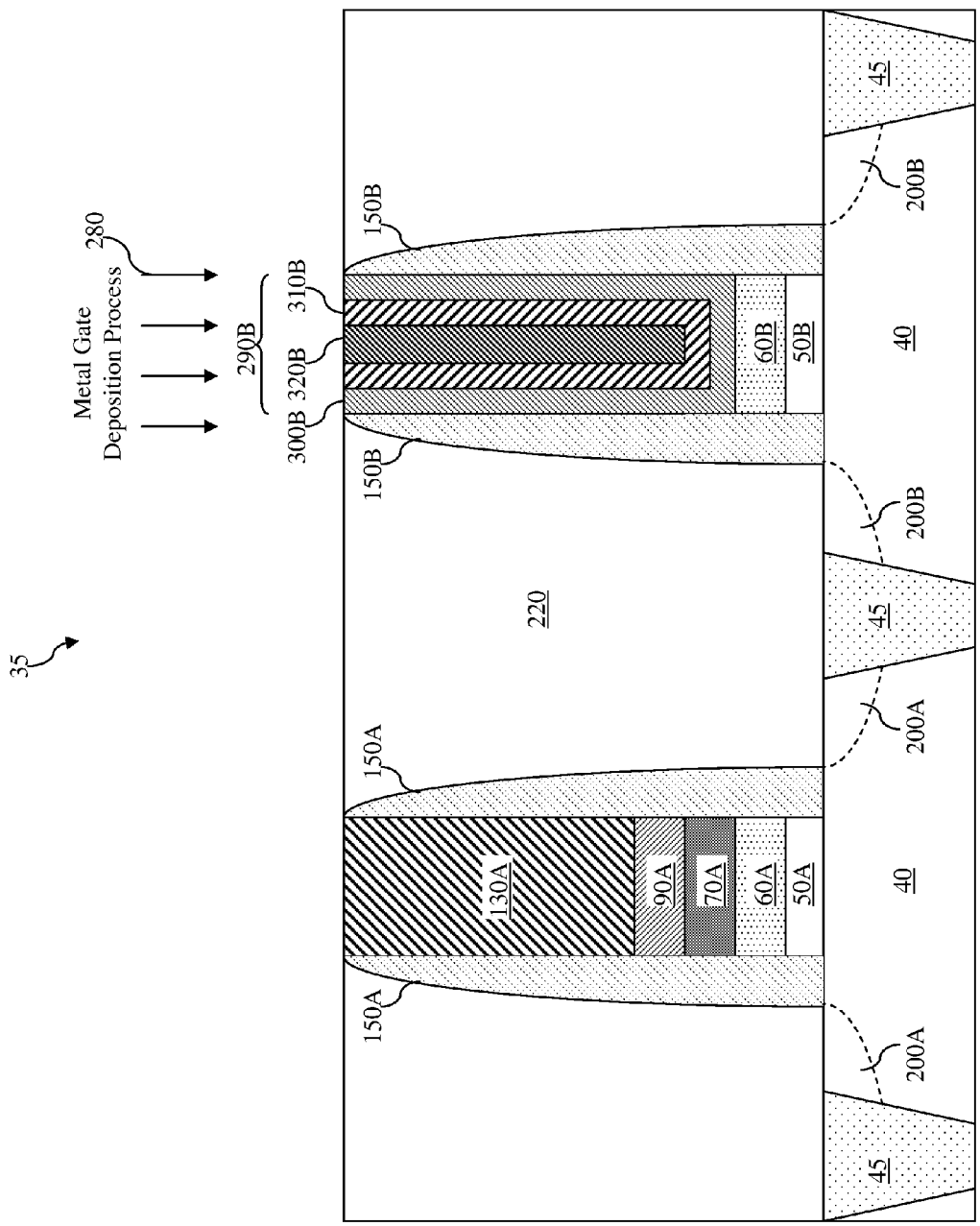
Figure 7B:
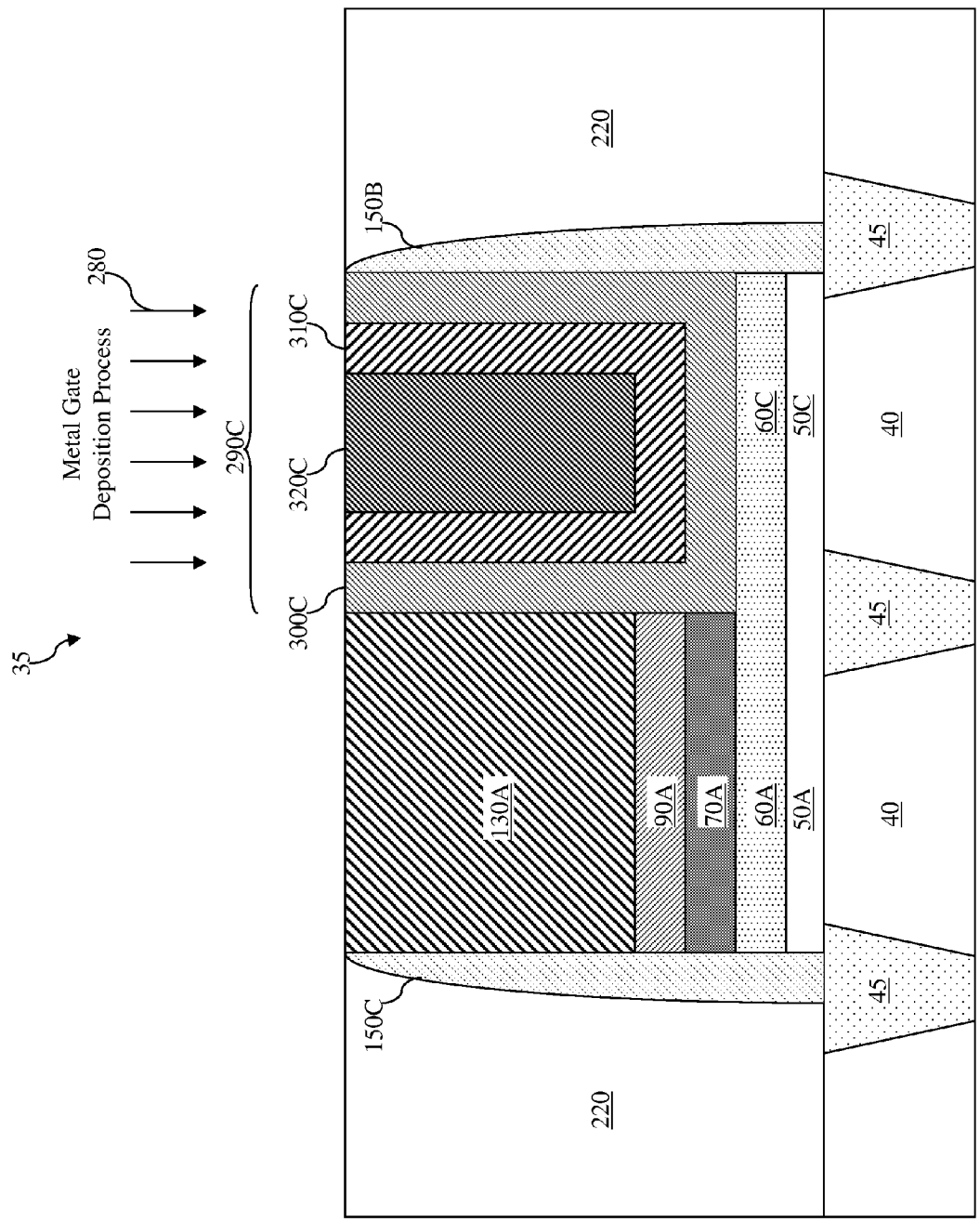

Referring to FIGS. 7A-7B, a metal gate deposition process 280 is performed to deposit metal gate electrodes 290B and 290C in the openings 270 and 271, respectively. The metal gate electrodes 290B and 290C include work function layers 300B-300C, blocking layers 310B-310C, and fill metal layers 320B-320C, respectively. The work function layers 300B-300C help tune a work function of the PMOS gate, such that a desired threshold voltage may be achieved for the PMOS transistor. In some embodiments, the work function layers 300B-300C include a P-type work function metal, which may contain titanium nitride (TiN), tungsten (W), tungsten nitride (WN), or tungsten aluminum (WAl) as examples.

The blocking layers 310B-310C are configured to block or reduce diffusion between the layer therebelow (e.g., the work function metal layer 300) and the layer thereabove (e.g., the fill metal layer 320). In some embodiments, the blocking layer 310B-310C includes TiN or tantalum nitride (TaN).

The fill metal layers 320B-320C are configured to serve as the main conductive portion of the PMOS gate electrode. In some embodiments, the fill metal layers 320B-320C contain aluminum (Al) or titanium (Ti). The fill metal layers 320B-320C may alternatively contain other conductive materials such as tungsten (W), copper (Cu), or combinations thereof. In other embodiments, a wetting layer (e.g., containing Ti) may be formed between the blocking layer and the fill metal layer.

It can be seen now that the semiconductor device 35 includes an NMOS transistor that has a polysilicon gate electrode (e.g., the gate electrode 130A), as well as a PMOS transistor that has a metal gate electrode (e.g., the gate electrode 290B or 290C). As such, the semiconductor device 35 may be referred to as a hybrid gate semiconductor device. The NMOS transistor is formed by a gate-first process, and the PMOS transistor is formed by a gate-last process.

Figure 8A:
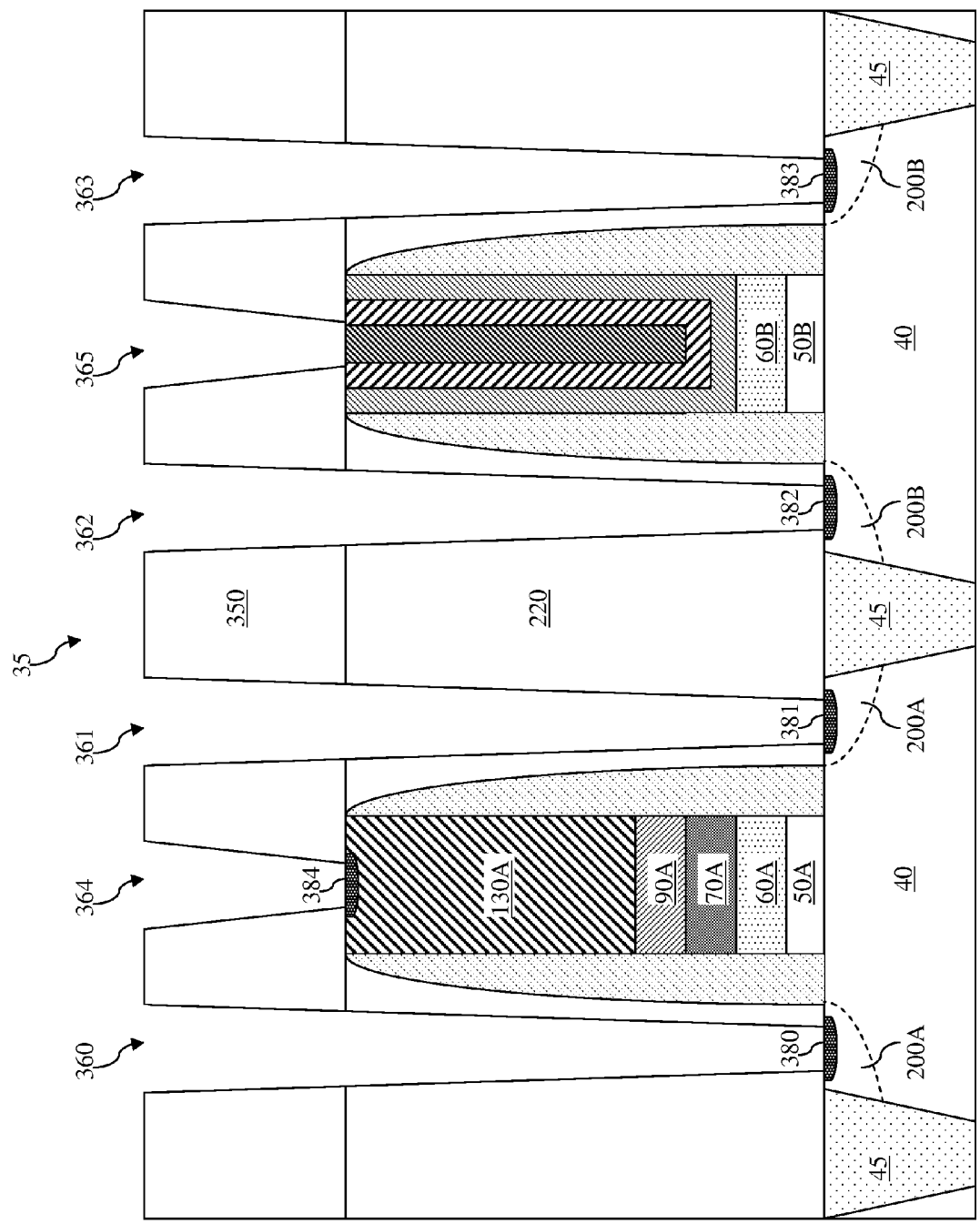
Figure 8B:
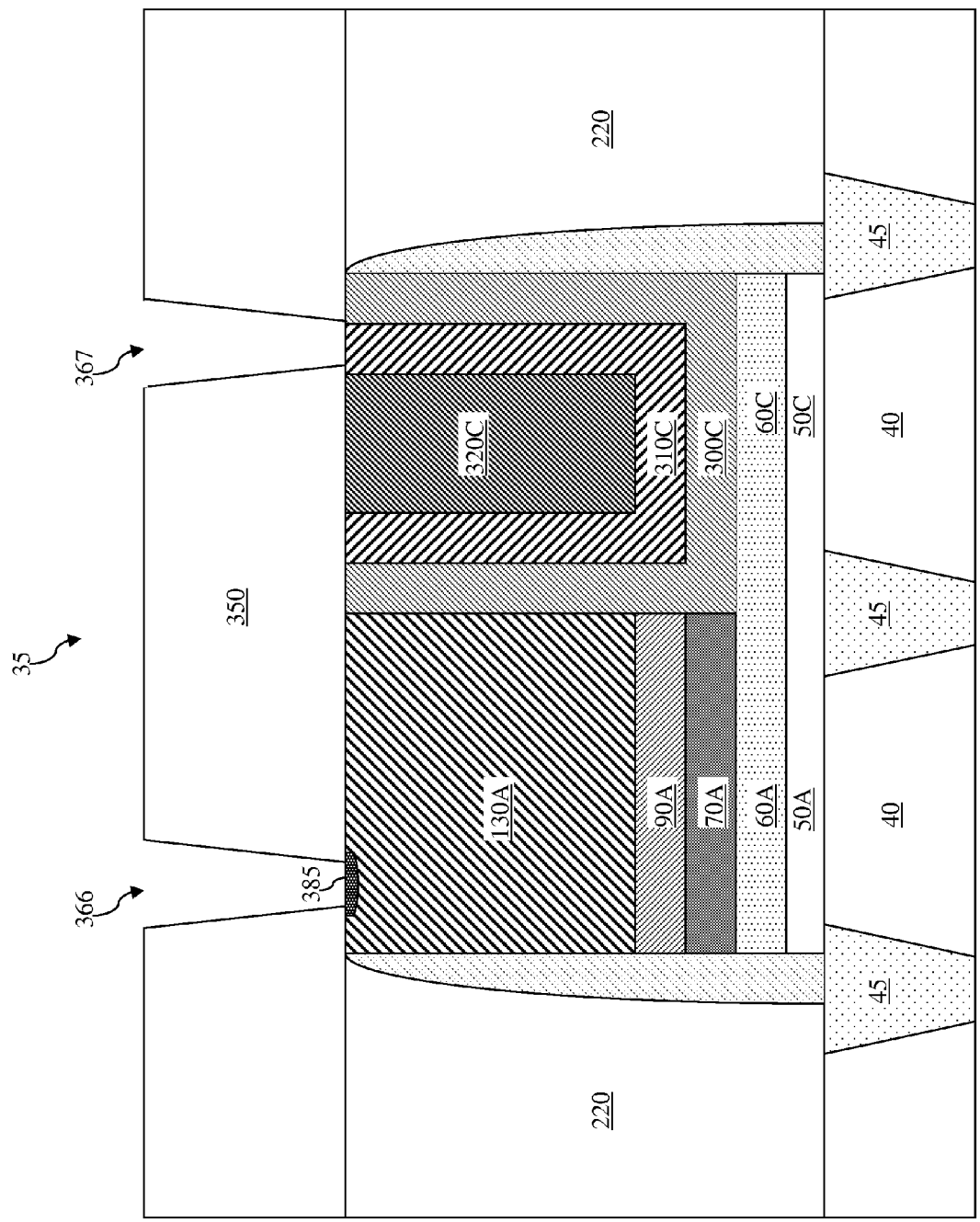

Referring to FIGS. 8A-8B, an inter-layer dielectric (ILD) layer 350 is formed over the ILD layer 220 and over the gate electrodes 130A and 290B-290C. The ILD layer 220 may be formed by a suitable deposition process known in the art. The ILD layer 350 may contain a substantially similar material as the ILD layer 220.

A plurality of contact holes 360-367 are formed in the semiconductor device 35. The contact holes 360-367. In some embodiments, the contact holes 360-367 are formed by an etching process known in the art. The contact holes 360-363 extend vertically through the ILD layers 220 and 350 and expose surfaces of the S/D regions 200A-200B in the substrate. The contact holes 364-367 extend vertically through the ILD layer 220 and expose surfaces of the polysilicon gate electrode 130A.

Thereafter, a silicidation process is performed to form silicide features 380-385 below the openings 360-364 and 366, respectively. The silicidation process may involve depositing a metal material in the regions of the semiconductor device 35 exposed by the contact holes 360-367 and performing a thermal process so that the deposited metal will reach with silicon to form metal silicide features. The silicide features 380-383 are formed in the S/D regions 200A-200B, and the silicide features 384-385 are formed in the polysilicon electrode 130A. In some embodiments, the silicide features 380-385 are nickel silicide (NiSi) features.

Figure 9A:
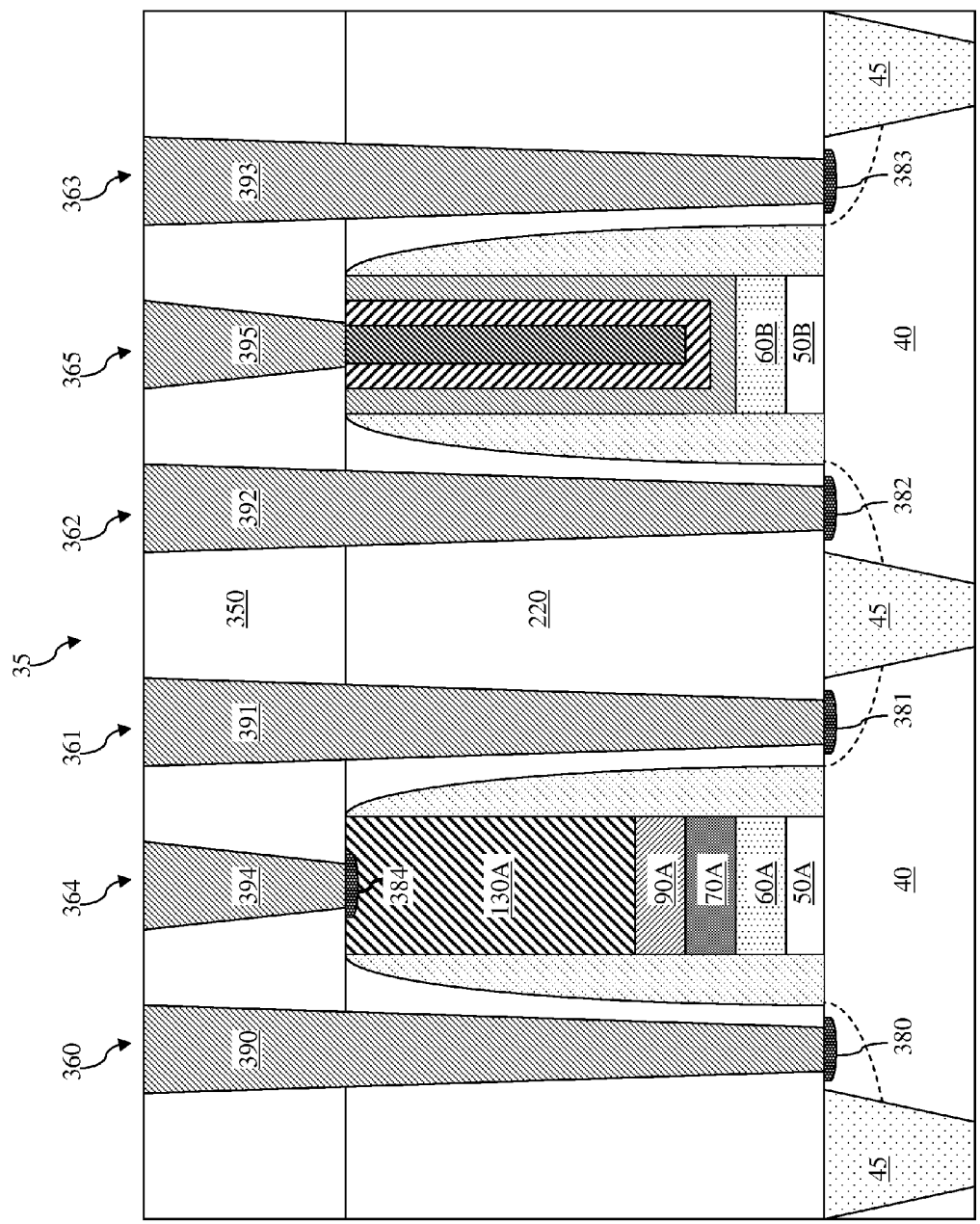
Figure 9B:
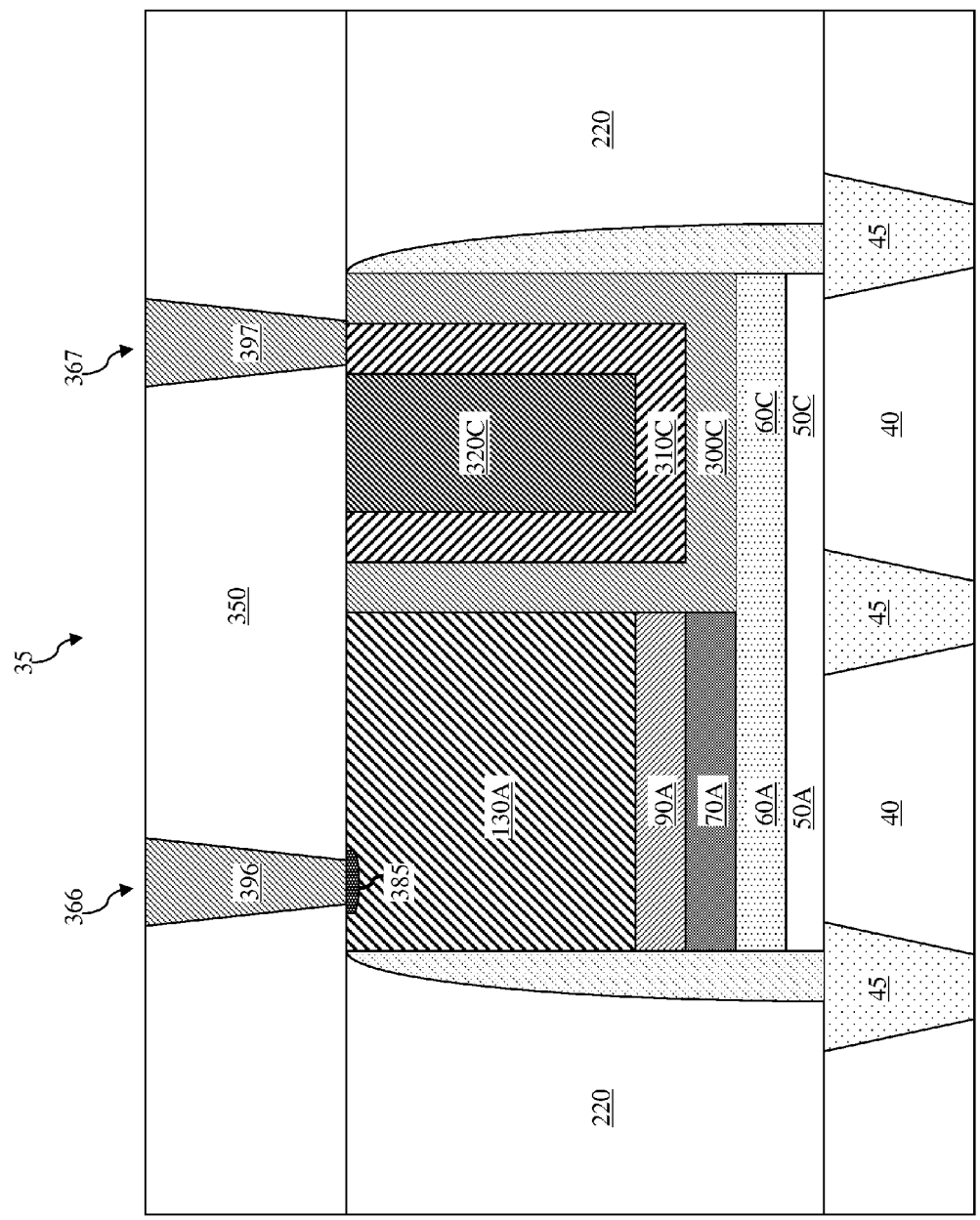

Referring now to FIGS. 9A-9B, a plurality of metal contacts 390-397 is formed to fill the contact holes 360-367. The metal contacts 390-397 may be formed by a suitable deposition process followed by a polishing process to planarize the surfaces of the metal contacts 390-397. In some embodiments, the metal contacts 390-397 contain tungsten. The metal contacts 390-394 and 396 are formed on the silicide features 360-364 and 366, respectively. The metal contacts 390-393 provide electrical access (or electrical coupling) to the S/D regions of the NMOS and PMOS transistors, and the metal contacts 394-397 provide electrical access to the gate electrodes of the NMOS and PMOS transistors.

It is understood that additional processes may be performed to complete the fabrication of the semiconductor device 35. For example, these additional processes may include deposition of passivation layers, formation of interconnect structures (e.g., lines and vias, metal layers, and interlayer dielectric that provide electrical interconnection to the device including the formed metal gate), packaging, and testing. For the sake of simplicity, these additional processes are not described herein. It is also understood that some of the fabrication processes for the various embodiments discussed above may be combined depending on design needs and manufacturing requirements.

Based on the above discussions, it can be seen that the present disclosure offers advantages over conventional methods. It is understood, however, that other embodiments may offer additional advantages, and not all advantages are necessarily disclosed herein, and that no particular advantage is required for all embodiment.

One advantage is that an extra dry etching process may be saved (i.e., no longer needed). In traditional gate replacement fabrication processes, the NMOS and PMOS dummy gate electrodes are removed separately. In other words, one dry etching process is used to remove the dummy gate electrode for the PMOS transistor, and a different dry etching process is used to remove the dummy gate electrode for the NMOS transistor. Each dry etching process may involve a plurality of process steps and may require the use of expensive fabrication tools. Therefore, it is desirable to reduce or eliminate the use of dry etching processes if possible. According to the embodiments of the present disclosure, only one dry etching process is used (to remove the dummy gate electrode for the PMOS transistor). The polysilicon gate electrode of the NMOS transistor is no longer a dummy gate and therefore need not be removed. Therefore, the present disclosure allows for simpler and cheaper fabrication compared to conventional fabrication methods.

Another advantage is that the embodiments of the present disclosure entail a single polishing process to planarize the metal gate electrode surface, rather than two separate polishing processes as in conventional fabrication. As discussed above, the conventional metal gate fabrication methods form the metal gates separately. In more detail, after the PMOS dummy gate electrode is removed, a plurality of deposition processes are performed to form a PMOS work function metal component and a fill metal component as the PMOS metal gate electrode in place of the PMOS dummy gate electrode. A polishing process such as a CMP process is then performed to planarize the PMOS metal gate electrode surface. When this is completed, similar procedures are performed to form an NMOS metal gate electrode in place of the NMOS dummy gate electrode, and another polishing process is then performed to planarize the NMOS metal gate electrode surface. Therefore, two separate polishing processes are needed for existing metal gate fabrication methods: one to polish the PMOS metal gate, and another to polish the NMOS metal gate.

In comparison, according to the embodiments of the present disclosure, only the PMOS transistor has a metal gate and therefore needs a polishing process. The NMOS transistor has a polysilicon gate and therefore does not need to be polished. In other words, according to the present disclosure, only a single polishing process is performed to planarize the surface of the PMOS metal gate electrode. Consequently, an extra polishing process (i.e., the polishing process that would have been required to polish the metal gate for NMOS transistor under a traditional fabrication process) can be eliminated, further reducing fabrication costs and shortening process time.

Therefore, it can be seen that the present disclosure pertains to forming a hybrid high-k metal gate, in that the NMOS transistor contains a polysilicon gate electrode, while the PMOS transistor contains a metal gate electrode. In addition, it is understood that although the various concepts of the present disclosure discussed above are illustrated using a planar hybrid high-k metal gate device, these concepts apply to a FinFET device as well. A typical FinFET device is fabricated with a thin "fin" (or fin-like structure) extending from a substrate. The fin usually includes silicon and forms the body of the transistor device. The channel of the transistor is formed in this vertical fin. A gate is provided over (e.g., wrapping around) the fin. This type of gate allows greater control of the channel. Other advantages of FinFET devices include reduced short channel effect and higher current flow. For reasons of simplicity, the details of the fabrication of the FinFET devices are not discussed herein.

One of the broader forms of the present disclosure involves a method of fabricating a semiconductor device. The method includes: forming a first gate structure and a second gate structure over a substrate, the first gate structure and the second gate structure each including a high-k dielectric layer located over the substrate, a capping layer located over the high-k dielectric layer, an N-type work function metal layer located over the capping layer, and a polysilicon layer located over the N-type work function metal layer; forming an inter-layer dielectric (ILD) layer over the substrate, the first gate structure, and the second gate structure; polishing the ILD layer until a surface of the ILD layer is substantially co-planar with surfaces of the first gate structure and the second gate structure; replacing portions of the second gate structure with a metal gate; and thereafter performing a silicidation process to the semiconductor device.

In some embodiments, the performing the silicidation process comprises: forming a plurality of contact holes in the semiconductor device; depositing a metal material through the contact holes; and performing a thermal treatment to the metal material to form a plurality of silicide features exposed by the contact holes.

In some embodiments, the method further comprises: before the forming the ILD layer, forming source/drain regions in the substrate, and wherein: a first subset of the contact holes exposes the source/drain regions; and a second subset of the contact holes exposes the metal gate and the polysilicon layer of the first gate structure.

In some embodiments, the method further comprises: after the silicide features are formed, filling the contact holes with a plurality of metal contacts.

In some embodiments, the replacing portions of the second gate structure is performed in a manner such that the polysilicon layer, the N-type work function metal layer, and the capping layer of the second gate structure are removed and replaced by the metal gate.

In some embodiments, the replacing portions of the second gate structure is performed in a manner such that the high-k dielectric layer of the second gate structure is un-removed, and wherein the metal gate is formed over the un-removed high-k dielectric layer.

In some embodiments, the replacing portions of the second gate structure comprises: forming a P-type work function metal layer on the un-removed high-k dielectric layer; forming a blocking metal layer on the P-type work function metal layer; and forming a fill metal layer on the blocking metal layer.

In some embodiments, no silicidation process is performed to the semiconductor device before the forming the ILD layer.

In some embodiments, the high-k dielectric layer has a dielectric constant greater than that of silicon dioxide; and the capping layer contains lanthanum oxide.

Another one of the broader forms of the present disclosure involves a method of fabricating a semiconductor device. The method includes: forming a high-k dielectric layer over a substrate; forming a capping layer over the high-k dielectric layer; forming a work function layer over the capping layer; forming a polysilicon layer over the work function layer; patterning the polysilicon layer, the work function layer, the capping layer, and the high-k dielectric layer to form a first gate and a second gate; forming an inter-layer dielectric (ILD) layer over the substrate, the ILD layer surrounding the first gate and the second gate; removing, from the second gate, the polysilicon layer, the work function layer, and the capping layer, thereby forming an opening in the second gate; forming a metal gate electrode in the opening, thereby forming a functional high-k metal gate; thereafter forming a plurality of contact holes in the semiconductor device; and forming a plurality of silicide features in portions of the semiconductor device exposed by the contact holes.

In some embodiments, the method further comprises: after the forming the silicide features, forming a plurality of metal contacts to fill the contact holes.

In some embodiments, the first gate and the second gate are free of having a silicide feature formed thereon before the forming the ILD layer.

In some embodiments, the forming the ILD layer includes: depositing a dielectric material over the substrate, the first gate, and the second gate; and polishing the dielectric material until the polysilicon layers of the first gate and the second gate are exposed.

In some embodiments, the first gate is a functional polysilicon gate for an NMOS transistor; and the second gate is a dummy gate for a PMOS transistor.

In some embodiments, the work function layer contains an N-type work function metal; and the metal gate electrode contains a P-type work function metal.

In some embodiments, the high-k gate dielectric has a dielectric constant greater than that of silicon dioxide; and the capping layer contains lanthanum oxide.

Yet another one of the broader forms of the present disclosure involves a semiconductor device. The semiconductor device includes: a substrate; an NMOS gate disposed over the substrate, wherein the NMOS gate includes: a first high-k gate dielectric, a capping layer disposed over the first high-k gate dielectric, and an N-type work function metal disposed over the capping layer, and a polysilicon gate electrode disposed over the N-type work function metal, wherein the capping layer and the N-type work function metal are configured to collectively tune a work function of the NMOS gate; and a PMOS gate disposed over the substrate and adjacent to the NMOS gate, wherein the PMOS gate includes: a second high-k gate dielectric, and a P-type metal gate electrode disposed over the second high-k gate dielectric, wherein the a portion of the P-type metal gate electrode is configured to tune a work function of the PMOS gate.

In some embodiments, the P-type metal gate electrode includes: a P-type work function metal disposed on the second high-k gate dielectric, wherein the P-type work function metal is the portion of the P-type metal gate electrode configured to tune the work function of the PMOS gate; a blocking layer disposed on the P-type work function metal; and a fill metal disposed on the blocking layer.

In some embodiments, the high-k gate dielectric has a dielectric constant greater than that of silicon dioxide.

In some embodiments, the capping layer contains lanthanum oxide; and the N-type work function metal contains titanium nitride.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of fabricating a semiconductor device, comprising:
    forming a first gate structure and a second gate structure over a substrate, the first gate structure and the second gate structure each including a high-k dielectric layer located over the substrate, a capping layer located over the high-k dielectric layer, an N-type work function metal layer located over the capping layer, and a polysilicon layer located over the N-type work function metal layer;
    forming an inter-layer dielectric (ILD) layer over the substrate, the first gate structure, and the second gate structure;
    polishing the ILD layer until a surface of the ILD layer is substantially co-planar with surfaces of the first gate structure and the second gate structure;
    replacing portions of the second gate structure with a metal gate; and
    after replacing portions of the second gate structure with the metal gate, performing a silicidation process to the semiconductor device, wherein performing the silicidation process to the semiconductor device includes performing the silicidation process to the polysilicon layer of the first gate structure to form a silicide feature.

2. The method of claim 1, wherein the performing the silicidation process comprises:
    forming a plurality of contact holes in the semiconductor device;
    depositing a metal material through the contact holes; and
    performing a thermal treatment to the metal material to form a plurality of silicide features exposed by the contact holes.

3. The method of claim 2, further comprising: before the forming the ILD layer, forming source/drain regions in the substrate, and wherein:
    a first subset of the contact holes exposes the source/drain regions; and
    a second subset of the contact holes exposes the metal gate and the polysilicon layer of the first gate structure.

4. The method of claim 3, further comprising: after the silicide features are formed, filling the contact holes with a plurality of metal contacts.

5. The method of claim 1, wherein the replacing portions of the second gate structure is performed in a manner such that the polysilicon layer, the N-type work function metal layer, and the capping layer of the second gate structure are removed and replaced by the metal gate.

6. The method of claim 1, wherein the replacing portions of the second gate structure is performed in a manner such that the high-k dielectric layer of the second gate structure is un-removed, and wherein the metal gate is formed over the un-removed high-k dielectric layer.

7. The method of claim 6, wherein the replacing portions of the second gate structure comprises:
    forming a P-type work function metal layer on the un-removed high-k dielectric layer;
    forming a blocking metal layer on the P-type work function metal layer; and
    forming a fill metal layer on the blocking metal layer.

8. The method of claim 1, wherein no silicidation process is performed to the semiconductor device before the forming the ILD layer.

9. The method of claim 1, wherein:
    the high-k dielectric layer has a dielectric constant greater than that of silicon dioxide; and
    the capping layer contains lanthanum oxide.

10. A method of fabricating a semiconductor device, comprising:
    forming a high-k dielectric layer over a substrate;
    forming a capping layer over the high-k dielectric layer;
    forming a work function layer over the capping layer;
    forming a polysilicon layer over the work function layer;

patterning the polysilicon layer, the work function layer, the capping layer, and the high-k dielectric layer to form a first gate and a second gate;

forming an inter-layer dielectric (ILD) layer over the substrate, the ILD layer surrounding the first gate and the second gate;

removing, from the second gate, the polysilicon layer, the work function layer, and the capping layer, thereby forming an opening in the second gate;

forming a metal gate electrode in the opening, thereby forming a functional high-k metal gate;

thereafter forming a plurality of contact holes in the semiconductor device; and forming a plurality of silicide features in portions of the semiconductor device exposed by the contact holes, and wherein the first gate is a functional polysilicon gate for an NMOS transistor and the second gate is a dummy gate for a PMOS transistor.

11. The method of claim 10, further comprising: after the forming the silicide features, forming a plurality of metal contacts to fill the contact holes.

12. The method of claim 10, wherein the first gate and the second gate are free of having a silicide feature formed thereon before the forming the ILD layer.

13. The method of claim 10, wherein the forming the ILD layer includes:
   depositing a dielectric material over the substrate, the first gate, and the second gate; and
   polishing the dielectric material until the polysilicon layers of the first gate and the second gate are exposed.

14. The method of claim 10, wherein:
   the work function layer contains an N-type work function metal; and
   the metal gate electrode contains a P-type work function metal.

15. The method of claim 10, wherein:
   the high-k gate dielectric has a dielectric constant greater than that of silicon dioxide; and
   the capping layer contains lanthanum oxide.

16. A method comprising:
   forming a high-k dielectric layer over a substrate;
   forming a polysilicon layer over the high-k dielectric layer;
   patterning the polysilicon layer and the high-k dielectric layer to form a first gate and a second gate;
   removing, from the second gate, the polysilicon layer thereby forming an opening in the second gate;
   forming a metal gate electrode in the opening, thereby forming a high-k metal gate;
   after forming the high-k metal gate, forming a silicide feature on the polysilicon layer of the first gate, and
   wherein the first gate is of a first type of conductivity and the high-k metal gate is of a second type of conductivity that is opposite the first type.

17. The method of claim 16, further comprising:
   forming a capping layer over the high-k dielectric layer; and
   forming a work function layer over the capping layer, and
   wherein patterning the polysilicon layer and the high-k dielectric layer to form the first gate and the second gate includes patterning the work function layer and the capping layer to form the first gate and the second gate.

18. The method of claim 17, wherein the work function layer is an N-type work function metal layer.

19. The method of claim 16, wherein forming the metal gate electrode in the opening includes:
   forming a work function metal layer on the high-k dielectric layer;
   forming a blocking metal layer on the work function metal layer; and
   forming a fill metal layer on the blocking metal layer.

20. The method of claim 16, further comprising:
   forming a lanthanum oxide material layer over the high-k dielectric layer; and
   forming a titanium nitride material layer over the lanthanum oxide material layer, and
   wherein patterning the polysilicon layer and the high-k dielectric layer to form the first gate and the second gate includes patterning the titanium nitride material layer and the lanthanum oxide material layer to form the first gate and the second gate.

* * * * *